United States Patent [19]

Zhang et al.

[11] Patent Number: 5,686,328

[45] Date of Patent: Nov. 11, 1997

[54] SEMICONDUCTOR DEVICE AND PROCESS FOR FABRICATING THE SAME

[75] Inventors: Hongyong Zhang; Jun Koyama; Satoshi Teramoto, all of Kanagawa, Japan

[73] Assignee: Semiconductor Energy Laboratory Co., Ltd., Kanagawa-ken, Japan

[21] Appl. No.: 272,735

[22] Filed: Jul. 11, 1994

[30] Foreign Application Priority Data

Jul. 14, 1993 [JP] Japan .................................. 5-196845

[51] Int. Cl.$^6$ ................................................ H01L 21/265
[52] U.S. Cl. ................................................ 437/41; 437/51
[58] Field of Search .......................... 437/21, 41 TFT, 437/42, 50, 51; 257/59, 72; 359/54, 59

[56] References Cited

U.S. PATENT DOCUMENTS

| | | |
|---|---|---|
| 5,359,206 | 10/1994 | Yamamoto et al. .................. 257/59 |
| 5,422,293 | 6/1995 | Konya ................................. 437/50 |
| 5,471,329 | 11/1995 | Nakajima et al. .................. 359/54 |
| 5,485,019 | 1/1996 | Yamazaki et al. .................. 257/59 |
| 5,521,107 | 5/1996 | Yamazaki et al. .................. 437/42 |

Primary Examiner—John Niebling
Assistant Examiner—Brendan Mee
Attorney, Agent, or Firm—Sixbey Friedman Leedom & Ferguson; Gerald J. Ferguson, Jr.; Evan R. Smith

[57] ABSTRACT

A semiconductor device suitable for active-matrix addressed liquid crystal display device equipped with pixel electrodes and comprising a thin film transistor and a capacitor formed on the same insulation substrate, provided that said capacitor is formed from an oxide insulation film provided on the lower electrode and a silicon nitride film. Highly reliable thin film transistors and capacitors can be obtained.

18 Claims, 6 Drawing Sheets

SEMICONDUCTOR DEVICE AND PROCESS FOR FABRICATING THE SAME

BACKGROUND OF THE INVENTION

1. Industrial Field of the Invention

The present invention relates to a semiconductor device comprising an insulated gate field effect transistor using a thin film semiconductor (hereinafter referred to simply as "TFT"). The present invention also relates to a constitution using a TFT applied to an active matrix-addressed liquid crystal display device (hereinafter referred to simply as active matrix liquid crystal display device).

2. Prior Art

Active matrix liquid crystal display devices using TFTs for driving the pixel portions thereof are known heretofore. In general, the pixel portions of active matrix liquid crystal display devices are constructed as such that one of the outputs from a TFT is connected to a pixel electrode and a capacitor. Thus, it is necessary to arrange the TFTs and the capacitors efficiently in the device. It is also required to form the capacitor in an area as small as possible to increase the aperture ratio of the pixels.

Concerning a TFT, on the other hand, well known is a structure comprising a gate electrode using aluminum as the principal component and having an oxide layer formed on the periphery thereof by anodically oxidizing the gate electrode. A TFT of this type is fabricated by forming an oxide layer on the upper surface and the sides of the aluminum gate to provide an insulation layer on the upper surface and an offset gate region on the periphery of the gate. The offset gate can be formed over a region corresponding to the thickness of the oxide layer formed on the periphery of the gate electrode at the same time the source/drain regions are formed by ion implantation. This technique realizes a TFT having a low off current.

The oxide layer thus formed by the anodic oxidation can be used as the dielectric for forming a capacitor. However, a capacitor using an aluminum oxide alone is problematic in that it yields inferior properties with respect to withstand voltage and high frequency characteristics. This problem can be overcome by establishing a capacitor using the interlayer dielectric formed on the upper surface of the aluminum oxide layer as the capacitor dielectric. However, this countermeasure newly poses another problem concerning the selection of the material constituting the interlayer dielectric.

Furthermore, the interlayer dielectric must have a thickness of at least 5,000 Å. Thus, if it is used as a capacitor dielectric, the capacity of the dielectric would become too large as to increase the aperture ratio. Moreover, the outermost surface of a dielectric for use in the pixel portions of an active matrix liquid crystal display device must be planarized. Accordingly, it is desired to use an organic resin such as polyimide for the interlayer dielectric. From the viewpoint of reliability and withstand voltage, as well as from the viewpoint of high frequency characteristics, however, it is not preferred to use an organic resin as the capacitor dielectric.

The process for fabricating TFTs for active matrix liquid crystal display devices furthermore comprises a step of cutting off a part of the aluminum-based gate line upon the completion of the anodic oxidation step. The aluminum material is then exposed to air at this instance, because the gate electrodes of the TFTs provided to each of the pixels, which had been electrically connected with each other, must be isolated according to each of the gate lines before the interlayer dielectric is formed to provide the outermost surface.

The step above must be effected before the interlayer dielectric is formed. However, the interlayer dielectric is formed by a heat treatment at a temperature not lower than 300° C. In particular, a baking step at a temperature of 300° C. is requisite in case an organic resin is used. The heat treatment brings about another problem of forming hillocks on the aluminum portion exposed to air. Hillocks must be suppressed because the formation thereof causes line failure or disconnection. The formation of an oxide layer by anodic oxidation, however, suppresses hillocks on the surface of aluminum, and allows the structure to undergo a heat treatment up to a temperature of about 400° C.

As described in the foregoing, the prior art processes for fabricating TFTs suitable for active matrix liquid crystal display devices have been found still unsatisfactory for forming capacitors having the desired capacity while increasing the aperture ratio. Furthermore, it has been found problematic to form the gate line in case of forming a gate line simultaneously with the gate electrode using a material based on aluminum, because hillocks were found to generate partially on the gate line.

SUMMARY OF THE INVENTION

Accordingly, an object to the present invention is to provide a TFT for use in active matrix liquid crystal display devices comprising capacitors with a favorable aperture ratio and a process for fabricating the same.

Another object of the present invention is to provide a TFT for use in active matrix liquid crystal display devices free of hillocks at the ends of gate lines and a process for fabricating the same.

Figure 1A:
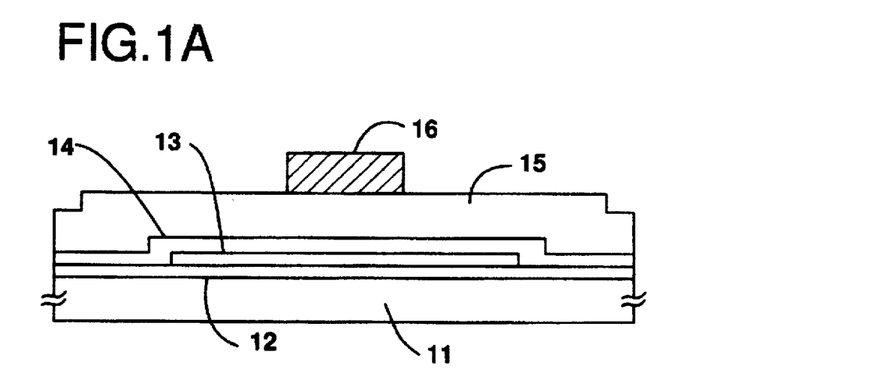
FIGS. 1(A) to 1(D) schematically show step-sequential cross section structures obtained in a process for fabricating a semiconductor device according to an embodiment of the present invention.
Figure 1B:
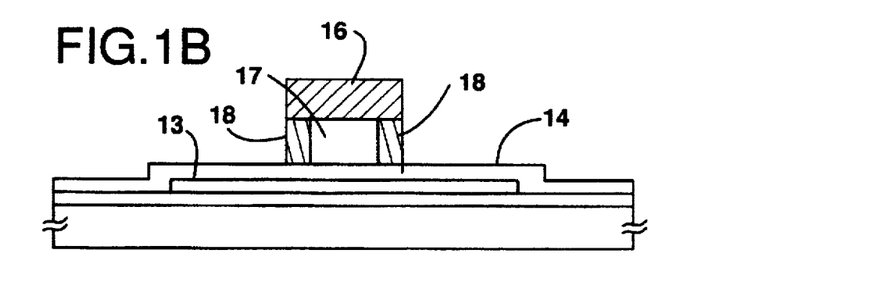
Figure 1C:
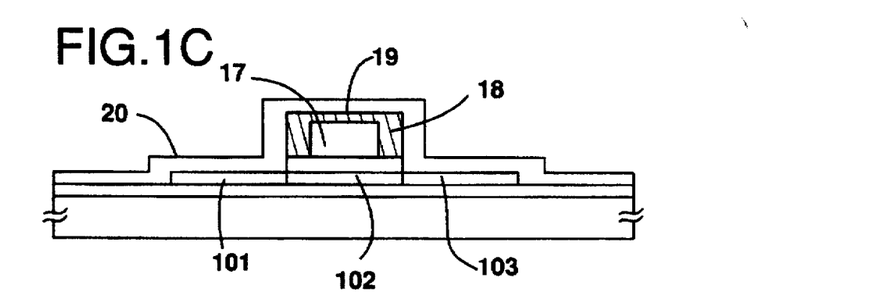

Thus, referring to FIG. 1(C), a TFT according to an embodiment of the present invention comprises an aluminum based gate electrode 17 surrounded by anodic oxide layers 18 and 19 and having a silicon nitride film 20 formed thereon. As a matter of course, the structure comprises source/drain regions 101 and 103 which are previously subjected to the steps of ion implantation and activation.

The silicon nitride film 20 functions as a protective film in case a laser beam is irradiated to the source/drain regions 101 and 103 to prevent the impurities from intruding the semiconductor layer. As read from FIG. 3(C), the silicon nitride film 20, together with an oxide layer 19, provides a capacitor dielectric. An ITO (indium tin oxide) electrode 105 provided as the pixel electrode and the aluminum common line 53, which is formed simultaneously with the gate electrode, establish the capacitor.

The process for fabricating the TFTs comprises isolating the aluminum-based electrodes surrounded by oxide layers and the lines from each other before forming the silicon nitride film. The portions which are newly exposed to air in this step are covered with a silicon nitride film to prevent hillocks from generating on the surface of the aluminum-based materials. Materials such as aluminum (Al), titanium (Ti), tantalum (Ta), chromium (Cr), molybdenum (Mo), silicon (Si), tungsten (W), and multilayered films thereof can be used for the gate electrode according to the present invention.

DETAILED DESCRIPTION OF THE PRESENT INVENTION

The present invention is described in further detail below referring to the preferred embodiment according to the present invention. It should be understood, however, that the present invention is not to be construed as being limited to the examples below.

EXAMPLE 1

Figure 1D:
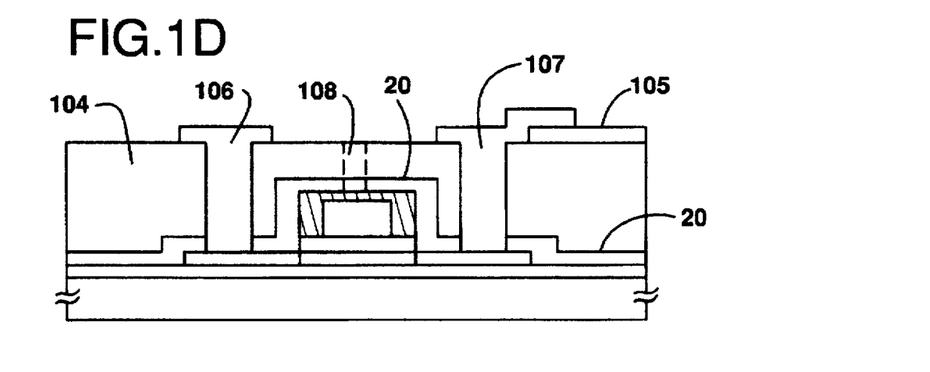
Figure 2A:
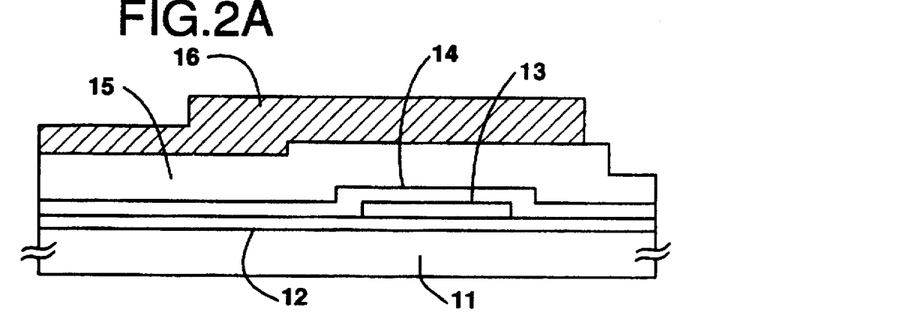
FIGS. 2(A) to 2(D) schematically show step-sequential cross section structures obtained in a process for fabricating a semiconductor device according to an embodiment of the present invention.
Figure 2B:
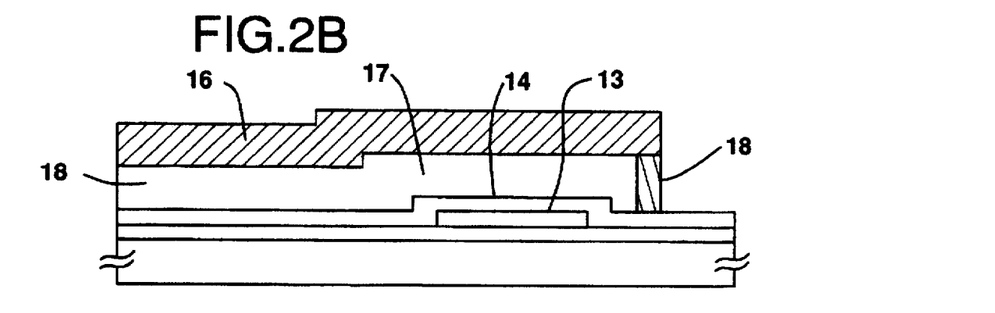
Figure 2C:
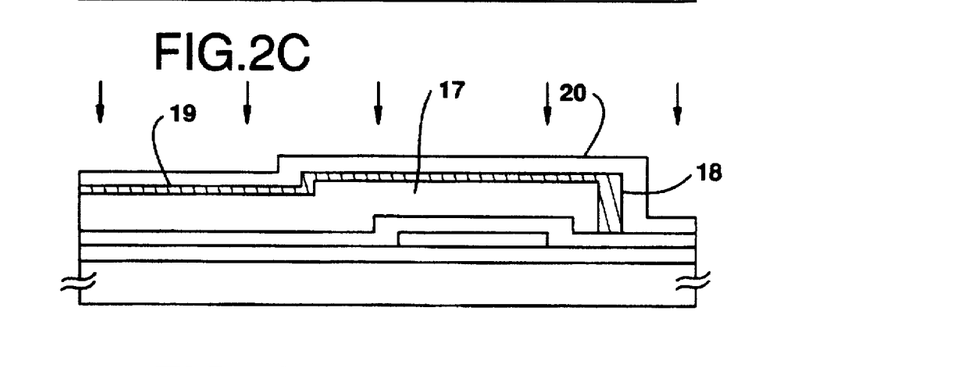
Figure 2D:
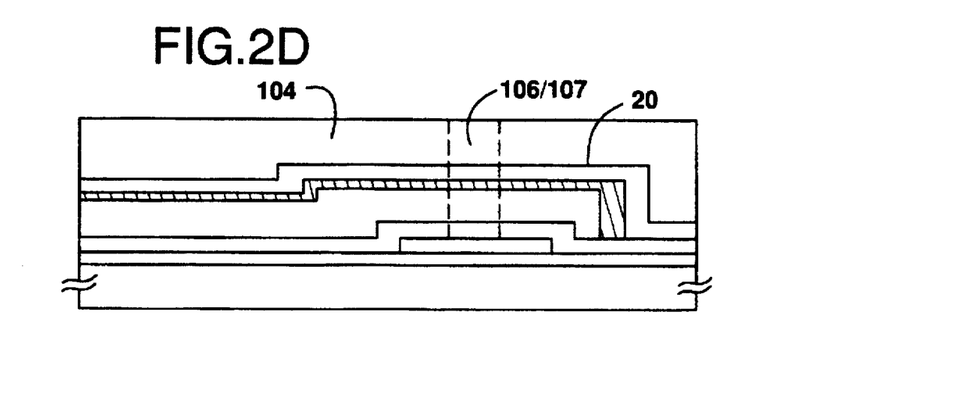
Figure 5:
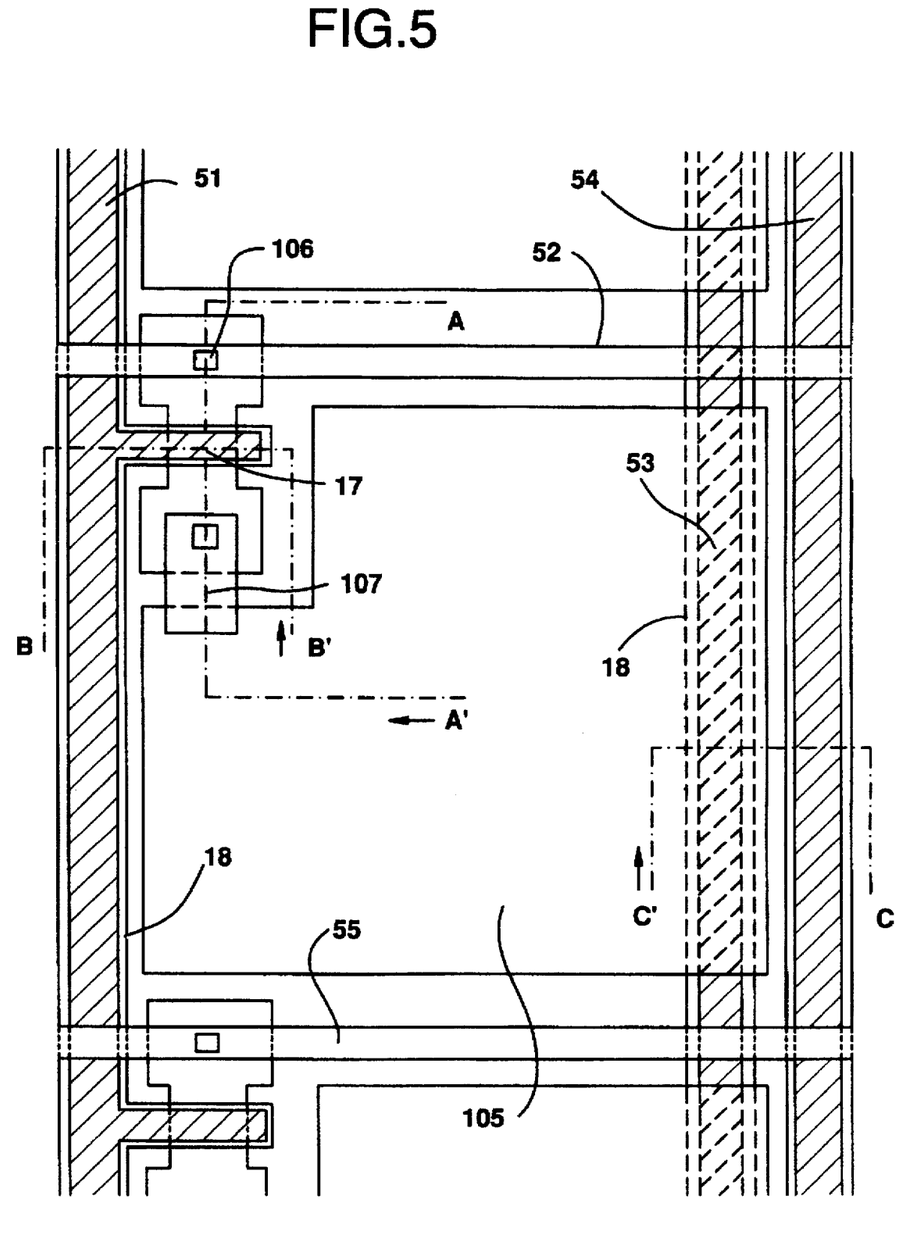
FIG. 5 shows a plan view of a semiconductor device according to the present invention.

The present example relates to an active matrix liquid crystal display device whose pixel portions are accompanied by TFTs and capacitors. The plan view shown in FIG. 5 schematically illustrates the global structure of the device. Referring to FIG. 5, the cross section taken on the line A—A' is shown in FIG. 1(D). The fabrication steps are given sequentially in FIGS. 1(A) to 1(D). Similarly, the cross section taken on the line B—B' is shown in FIG. 2(D), and the step-sequential structures are given in FIGS. 2(A) to 2(D). The cross section taken on the line C—C' is shown in FIG. 3 (D), and the corresponding step-sequential structures can be followed by referring to FIGS. 3(A) to 3(D). In the figures, those having the same alphabet attached to the number of the figure, e.g., (A), (B), (C), or (D) illustrate the structures at the same process step. For instance, the structure illustrated in FIG. 1(B) is in the same process step as that for the structures illustrated in FIG. 2(B) and FIG. 3(B). As a rule, the same portions or the portions made from the same material in the same process step are denoted with the same symbol in the figures.

FIG. 4 shows the edge portion of the gate line, and is not shown in FIG. 5. The "step (A)" as referred hereinafter encompasses the step illustrated by all of the FIGS. 1(A), 2(A), 3(A), and 4(A); i.e., the structures shown in the figures are formed simultaneously in the same step.

The portions in which the step-sequential evolution thereof is shown by the four diagrams are described below. FIGS. 1(A) to 1(D) show the cross section of a TFT, and are taken on the line A—A' given in FIG. 5. FIGS. 2(A) to 2(D) also show the cross section of a TFT, and are taken on the line B—B' making a right angle with the line A—A' given in FIG. 5. FIGS. 3(A) to 3(D) show the structural change of a common line provided on the left hand side of the figure and of a gate line provided on the side opposite to the common line. FIGS. 3(A) to 3(D) are taken on the line C—C' given in FIG. 5. FIGS. 4(A) to 4(D) show the step-sequential structures of the gate line which is not illustrated in FIG. 5.

The process steps for fabricating the semiconductor device according to the present invention is described below. In step (A), a silicon oxide film 12 is deposited as a base film to a thickness of 2,000 Å by means of sputtering on an insulating surface of a glass substrate 11. A silicon film is formed thereon, and the film is subjected to isolation patterning to form an active layer 13. Source/drain regions as well as a channel forming region are formed in the active layer 13. The active layer can be made of any type of silicon film, for example, an amorphous silicon film, a microcrystalline silicon film, a polycrystalline silicon film, or a crystalline silicon film of any type. In general, practically useful is a vapor-phase deposited amorphous silicon film rendered crystalline by heating or by irradiating a laser light or an intense light to the as-deposited silicon film.

A silicon oxide film is deposited to a thickness of 1,000 Å by sputtering to provide a gate dielectric 14. Then, a film 15 containing aluminum as the principal component is deposited to a thickness of 5,000 Å to provide a gate electrode and a gate line. Preferably, at least one of the elements selected from the group consisting of tantalum (Ta), titanium (Ti), silicon (Si), and scandium (Sc) is incorporated into the aluminum-based film to effectively prevent hillock from generating in the heating step. In the present example, Sc was added at an amount of 2% by weight.

A resist mask 16 is formed thereafter to use in the patterning of gate line. Thus is obtained the structure corresponding to step (A). FIG. 5 shows the gate lines 51 and 54 formed in this manner. A common line 53 is formed at the same time with the gate lines using the same material, and constitutes the other electrode of the capacitor. A gate electrode 17 is formed on the extension of the gate line in the same step for forming the gate line.

In step (B), the aluminum film 15 is patterned as shown in FIG. 5 to provide simultaneously the gate lines 51 and 54 and the gate electrode 17. Furthermore, a first anodic oxidation step is effected on the structure having the resist mask 16 to form an oxide layer 18 on the patterned gate electrode 17 and the gate lines 51 and 54, as well as on the side of the common line 53 exposed to air. The anodic oxidation process can be effected to provide a porous oxide layer, using a 3 to 20% aqueous solution of citric acid, or an aqueous solution of nitric acid, phosphoric acid, chromic acid, sulfuric acid, etc., under a low voltage of about 10 V. The porous oxide layer obtained in this step is particularly effective in forming offset gate regions in the later step of implanting ions into source/drain regions, because it can be formed to a thickness as desired. However, it is not a dense film; hence, it is unfavorable considering the problem of withstand voltage.

Then, a second anodic oxidation is effected after removing the resist mask. The anodic oxidation is performed using an ethylene glycol solution containing from 3 to 10% of tartaric acid, boric acid, and nitric acid, and it results in the formation of a dense and hard oxide layer. However, the process requires applying a high voltage of 200 V or higher, and it is difficult to form a film as thick as to exceed a thickness of 2,000 Å. Thus, it is effective to form a porous oxide layer 18 to a thickness of about 3,000 Å, and then thinly forming a dense oxide layer 19 to a thickness of about 1,000 Å as shown in the structures corresponding to step (C).

Figure 3A:
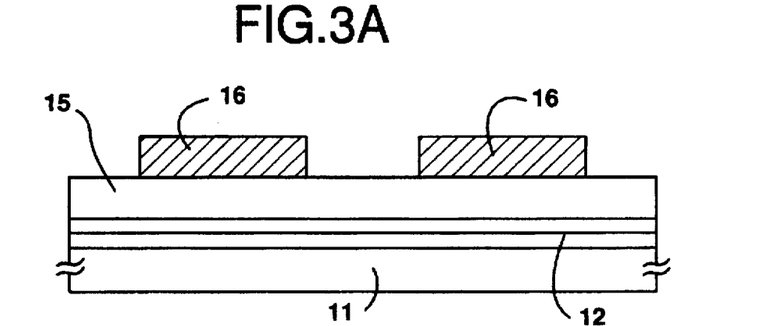
FIGS. 3(A) to 3(D) schematically show step-sequential cross section structures obtained in a process for fabricating a semiconductor device according to an embodiment of the present invention.
Figure 3B:
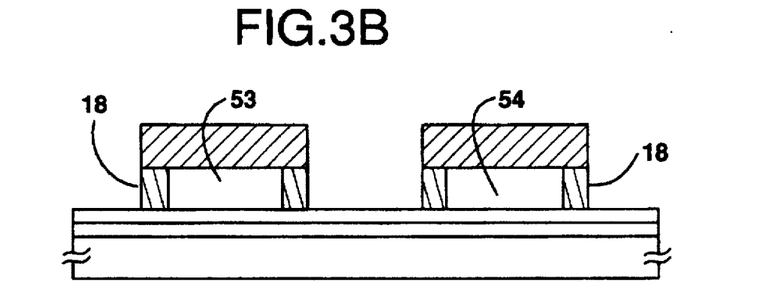
Figure 3C:
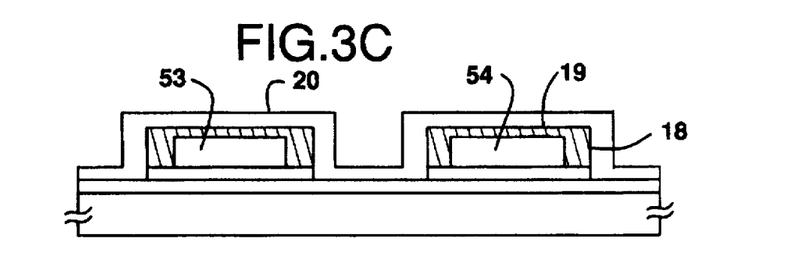
Figure 3D:
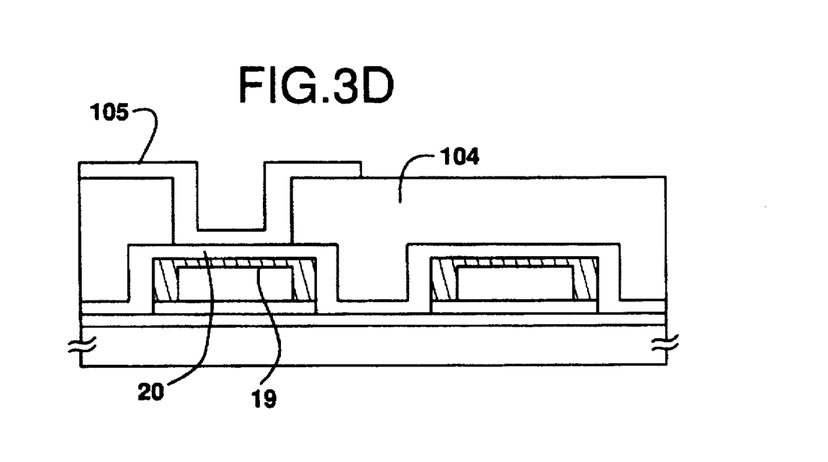

Thus, an oxide layer (preferably about 3,000 Å in thickness) necessary for forming an offset gate region is formed on the side of the gate electrode 17, and a dense oxide layer is formed thereafter on the top of the gate electrode 17. Furthermore, though not shown in the figure, a dense and thin oxide layer is formed on the side of the gate electrode 17. The thin oxide layer 19 formed in the second anodic oxidation step is also utilized for the formation of a capacitor as shown in FIG. 3(C). The dense film having an excellent withstand voltage can be advantageously used in the capacitors.

Thus, a gate electrode 17 and gate lines 51 and 54, as well as a common line 53 are formed in step (C). It can be seen that an oxide layer is formed on the periphery of the gate electrode and the gate lines.

Figure 4A:
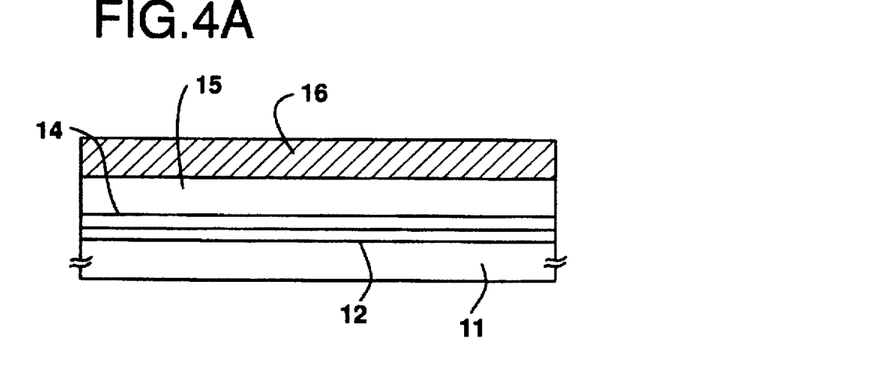
FIGS. 4(A) to 4(D) schematically show step-sequential cross section structures obtained in a process for fabricating a semiconductor device according to an embodiment of the present invention.
Figure 4B:
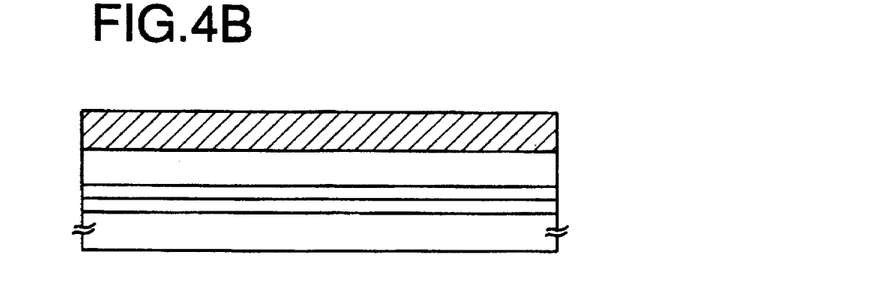
Figure 4C:
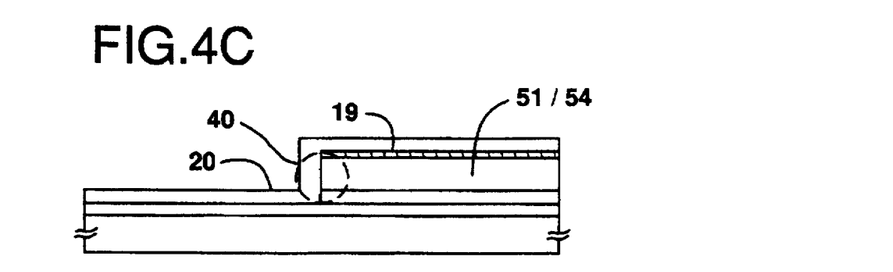

Referring to FIG. 4(C), the edge portions of the gate lines 51 and 54, as well as the edge of the common line 53 are cut off. At this stage, a part of the gate line is cut to directly expose aluminum to air. Furthermore, referring to FIG. 1(C), the silicon oxide film 14 except for the gate electrode 17 and the gate lines 51 and 54 is removed either before or after the step of cutting the edge portions of the common and gate lines.

A silicon nitride film 20 is deposited to a thickness of from 100 to 2,000 Å. In this example, a 1,000 Å thick silicon nitride film was formed. The silicon nitride film 20 in general is deposited by means of plasma CVD using ammonia and silane. Otherwise, sputtering may be selected as a means for depositing the silicon nitride film.

Thus, referring to FIG. 4, it can be seen that the edge 40 of the aluminum gate line 51 or 54 is covered with the silicon nitride film 20. Hillocks can be completely prevented from generating in the later step of heating. As a matter of course, the edge of the common electrode 53 is also covered in this step with the silicon nitride film 20.

Referring to FIG. 1(C), phosphorus (P) or boron (B) is introduced into the source and the drain regions by ion implantation to form the source and the drain regions 101 and 103. Thus, the source and the drain regions 101 and 103 are formed together with the channel forming region in a self aligned manner. The resulting structure after the ion implantation is annealed by irradiating thereto a laser light or an intense light. Then, the gate electrode or the gate lines can be effectively subjected to heat treatment at a temperature of about 300° C. during the annealing without any fear of forming hillocks, because the periphery of the gate electrode and the gate lines are covered by an anodic oxide layer.

Furthermore, the crystallinity of the source and the drain regions can be further improved during the irradiation of a laser light or an intense light, because the surface of the source and the drain regions is covered with a silicon nitride film. Accordingly, the sheet resistance on the surface of the source and the drain regions can be lowered to further improve the characteristics of the TFT.

Referring to FIG. 4(C), it can be seen that the edge portion 40 of the gate line is covered with a silicon nitride film upon the formation of the silicon nitride film 20. Accordingly, a structure comprising aluminum portions free from hillocks can be implemented at the later step of heat treatment.

A polyimide interlayer dielectric 104 is formed thereafter. Polyimide is used in this case to obtain a planarized outermost surface. Then, contact holes (indicated by numerals 106 and 107 in FIG. 1) to the source and the drain regions are perforated while simultaneously removing the interlayer dielectric corresponding to the portion on which a capacitor is formed (see FIG. 3(D)). Furthermore, a contact hole (indicated with numeral 41 in FIG. 4) for the gate line 51 or 54 is perforated at the edge portion thereof simultaneously with the formation of the contact holes for the source and the drain regions and the removal of the interlayer dielectric.

Since the second anodic oxide film is formed thinly, the contact hole can be formed easily in the formation of the contact hole to the gate line.

An ITC electrode 105 is formed thereafter to provide the pixel electrode as shown in FIGS. 1 and 3. Furthermore, the source and the drain electrodes 106 and 107 as well as the contact electrode 41 to the gate line are formed. The use of a two-layered film of titanium nitride and aluminum film for the electrode lines is effective for lowering the contact resistance. The pixel portion is thus completed as shown in the plan view of FIG. 5. As a matter of course, numerous electrodes (for instance, several hundred thousands or more electrodes) similar to the one described above are formed simultaneously.

Referring to FIG. 3, the process for fabricating a capacitor in the portion corresponding to the line C—C' in FIG. 5 is described below. The ITC electrode 105 and the common electrode 53 constitute the capacitor. The capacity C of the capacitor is determined by the area of the facing electrodes S, the dielectric constant ε, and the distance between the electrodes d, according to the following equation $$C = \varepsilon S/D.$$

The oxide layer 19 which functions as the dielectric for the capacitor can be provided thinly at a thickness of 1,000 Å by employing the aforementioned constitution. Yet, a specific inductive capacity of about 8 can be obtained for the oxide layer. In addition, a thin silicon nitride film 20 is formed at a thickness of 1,000 Å but with a high specific inductive capacity of about 6. Thus, a compact capacitor capable of yielding the predetermined capacity can be fabricated as a result. More specifically, the portion in which the common line 53 is superposed on the pixel electrode 105 corresponds to the capacitor portion. Thus, as shown in FIG. 5, the area of the capacitor can be reduced while reversely increasing the aperture ratio.

Figure 4D:
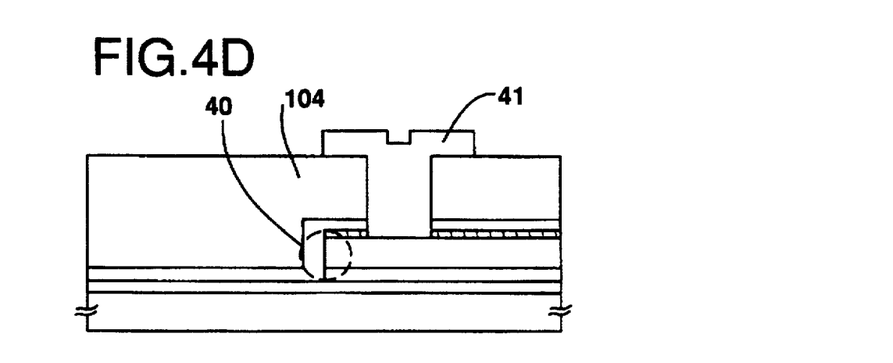

Referring to FIG. 4(D), moreover, the edge portions of the gate lines 51 and 54 as well as the edge portion of the common line are coated with a silicon nitride film. Thus, hillocks can be prevented from generating on the portion 40 during the steps of activating the source and the drain regions and of heat treatment for the formation of interlayer dielectrics.

EXAMPLE 2

The present example relates to a semiconductor device based on a TFT described in Example 1, except that a lightly doped drain (LDD) structure is realized in addition to the offset gate structure. The step-sequential process steps for fabricating the device according to the present example is shown in FIG. 6. The fabrication process is described below.

Referring first to FIG. 1(A), a silicon oxide film 12 is deposited as a base coating to a thickness of 2,000 Å on a glass substrate 11 by sputtering. A crystalline silicon film 1,000 Å in thickness is formed further thereon to provide the active layer 13. In the present example, the crystalline active layer 13 is obtained by thermally crystallizing an amorphous silicon film deposited previously by means of plasma CVD. Then, the active layer 13 is established by subjecting the thus deposited film above to a step of element isolation. Then, a gate insulating film 14 is formed.

An aluminum film 15 is deposited thereafter to a thickness of 5,000 Å to provide a gate electrode. Thus is obtained a structure shown in FIG. 1(A). A gate electrode 17 is formed by patterning the aluminum film using a mask 16. Then, a first anodic oxidation is effected in the same manner as in Example 1 to form a 3,000 Å thick porous anodic oxide film 18 on the periphery of the gate electrode 17. Thus is obtained the structure illustrated in FIG. 6(A).

Figure 6A:
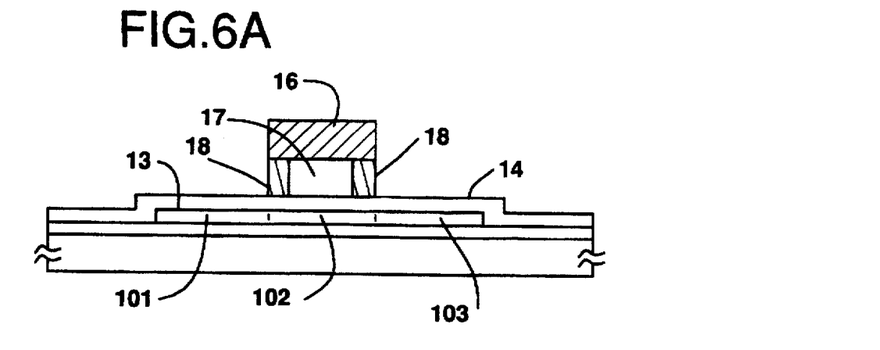
FIGS. 6(A) to 6(D) schematically show step-sequential cross section structures obtained in a process for fabricating a semiconductor device according to another embodiment of the present invention.

The source and drain regions 101 and 103 are lightly doped with phosphorus (P) or boron (B) by effecting the first ion implantation. In this case, the resist mask 16 as well as the gate electrode 17 and the peripheral oxide layer 18 function as a mask for the ion implantation. Thus are the ions implanted into the regions 101 and 103 in a self-aligned manner. The ions are introduced into the regions 101 and 103 at a dose of from $0.3 \times 10^{14}$ to $5 \times 10^{14}$ cm$^{-2}$, for example, at a dose of $1 \times 10^{14}$ cm$^{-2}$ to impart either a weak N-type or P-type semiconductive properties to the source and drain regions 101 and 103.

Figure 6B:
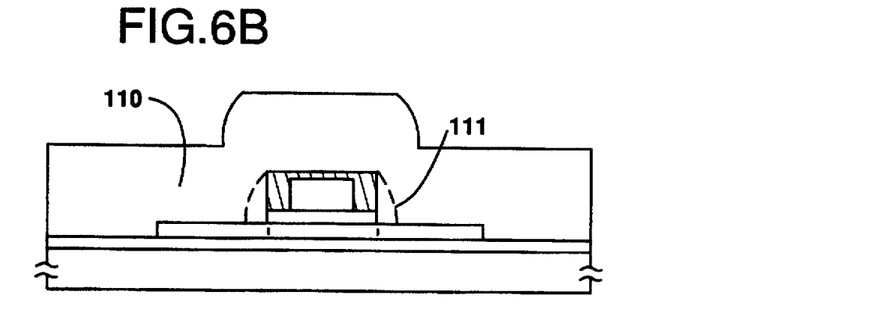
Figure 6C:
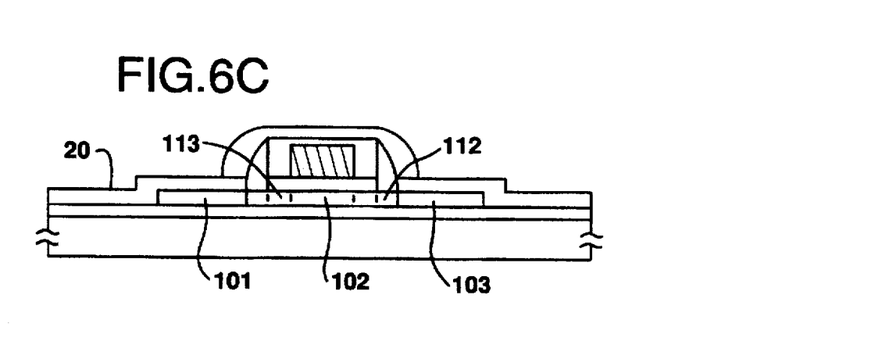
Figure 6D:
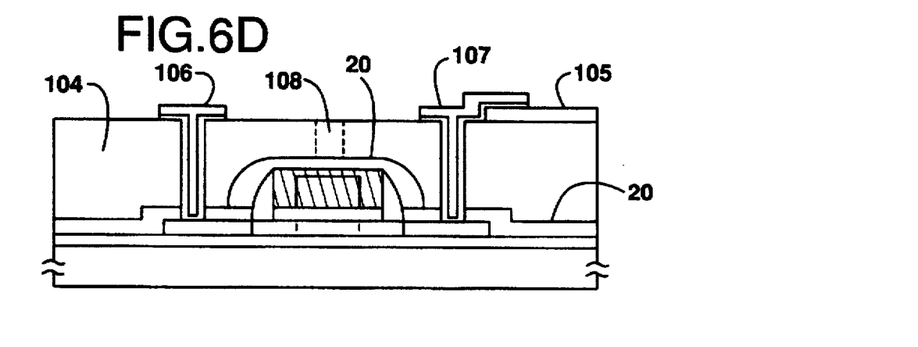

The silicon oxide film 14 exposed to air is removed thereafter, and a silicon oxide film 110 as shown in FIG. 6(B) is deposited to a thickness of 8,000 Å. Then, perpendicular anisotropic etching is effected by means of reactive ion etching (RIE) to leave over a silicon oxide portion 111 shaped approximately into a triangle. The width of the residual portion 111 shaped into approximately into a triangle can be roughly determined by the film thickness of the silicon oxide film 110. In general, the silicon oxide film 110 is deposited to a thickness corresponding to two to five times the width of the triangular residue. The residual portion 111 may appear to have a rectangular shape, however, it is simply referred to hereinafter as having an approximately triangular shape.

The silicon oxide film 110 in the present example is deposited at a thickness of 8,000 Å. Accordingly, the width of the residual portion 111 can be set at approximately 2,000 Å. A second ion implantation is effected thereafter. The ion implantation is performed by doping the source and drain regions 101 and 103 with the same impurity as that used in the first ion implantation at a dose of from $1 \times 10^{15}$ to $8 \times 10^{15}$ cm$^{-2}$. The ion implantation is effective mainly on the portion outside the residual portion 111 which functions as a mask. The portion 112 remains as a lightly doped region while the regions 101 and 103 are rendered N- or P-conductive by the further ion implantation to give the source and drain regions.

Thus is implemented a TFT structure comprising an offset gate region 113 and a lightly doped region 112. In the present example, the offset gate region is formed to a width of 3,000 Å according to the anodic oxide layer 18 of aluminum, and the lightly doped region is formed to a width of 2,000 Å depending on the residual portion 111. However, the width of the offset gate region and the lightly doped region can be determined in accordance with the desired characteristics of the TFT being formed.

A silicon nitride film 20 is deposited to a thickness of 1,000 Å after the second ion implantation. An interlayer dielectric 104 is formed with a polyimide resin, and is subjected to perforation to form a pixel electrode, i.e., an ITO electrode 105, a source and a drain electrode 104 and 107, and a gate electrode 108. Preferably, the source and drain electrodes, the gate electrode, and the lines thereof are formed by a two-layered structure comprising a lower titanium nitride and an upper aluminum to reduce the contact resistance. Thus is implemented a TFT on a pixel in the same manner as in Example 1. The pixel electrode is connected with one of the source and the drain.

As described in detail referring to the examples above, the present invention provides a stable and reliable pixel structure yet having a high aperture ratio by forming the capacitor using a silicon nitride film. Moreover, the structure is realized free of hillocks by using an aluminum line for the gate line and forming an oxide layer on the periphery thereof, because the cut aluminum portions exposed to air can be covered with the silicon nitride film to prevent hillocks from occurring on the later steps of heat treatment.

While the invention has been described in detail and with reference to specific embodiments thereof, it will be apparent to one skilled in the art that various changes and modifications can be made therein without departing from the spirit and scope thereof.

What is claimed is:

1. A process for fabricating a semiconductor device comprising:
   forming a member comprising a gate electrode and wiring of a transistor and one of a pair of electrodes of a capacitor from a material selected from aluminum, titanium, tantalum, chromium, molybdenum, silicon, and tungsten;
   forming an oxide layer on a surface of the member;
   cutting the member;
   forming a silicon nitride film covering the member and the oxide layer; and
   forming a pixel electrode on the silicon nitride film to form a capacitor comprising the member, the pixel electrode, the oxide layer and the silicon nitride film,
   wherein the silicon nitride film forming step is carried out after the cutting step.

2. The process of claim 1 wherein the oxide layer forming step is carried out by anodic oxidation.

3. The process of claim 1 wherein the oxide layer and the silicon nitride film are provided between the member and the pixel electrode.

4. The process of claim 1 wherein the pixel electrode is connected with one of source and drain of the transistor.

5. The process of claim 1 wherein the cutting step is carried out after the oxide layer forming step.

6. A process for fabricating a semiconductor device comprising:
   forming a member comprising a gate electrode and wiring of a transistor and one of a pair of electrodes of a capacitor from a material comprising aluminum;
   forming an oxide layer on a surface of the member;
   cutting the member;
   forming a silicon nitride film covering the member and the oxide layer; and
   forming a pixel electrode on the silicon nitride film to form a capacitor comprising the member, the pixel electrode, the oxide layer and the silicon nitride film,
   wherein the member contains an element selected from the group consisting of Ta, Ti, Si and Sc,
   wherein the silicon nitride film forming step is carried out after the cutting step.

7. A process for fabricating a semiconductor device comprising:
   forming a wiring comprising an oxidizable material over a substance;
   forming a first insulating film comprising an oxide of said oxidizable material by oxidizing a surface of said wiring;
   cutting said wiring after oxidizing said surface so that a portion of said wiring is exposed;
   forming a second insulating film on said wiring after the cutting step; and then
   forming an electrode on said second insulating film so that a capacitor is formed between said wiring and said electrode with said second insulating film therebetween, wherein the exposed portion of said wiring is covered by said second insulating film.

8. The process of claim 7 wherein said oxidizing step is carried out by anodic oxidation.

9. The process of claim 7 wherein said oxidizable material comprises a metal selected from aluminum, titanium, tantalum, chromium, molybdenum, silicon, and tungsten.

10. The process of claim 7 wherein said second insulating film comprises silicon nitride.

11. A process for fabricating an electro-optical device comprising:

forming a transistor having source and drain regions over a substrate for switching a pixel;

forming a wiring comprising an oxidizable material over said substrate;

forming a first insulating film comprising an oxide of said oxidizable material by oxidizing a surface of said wiring;

cutting said wiring after oxidizing said surface so that a portion of said wiring is exposed;

forming a second insulating film on said wiring after the cutting step so that the exposed portion of said wiring is covered by said second insulating film;

forming a pixel electrode on said second insulating film so that a capacitor is formed between said wiring and said electrode with said second insulating film therebetween, said capacitor being associated with said pixel;

wherein said gate electrode is distant from at least one of said source and drain regions to provide an offset region adjacent to said at least one of the source and drain regions.

12. The process of claim 11 wherein said oxidizing step is carried out by anodic oxidation.

13. The process of claim 11 wherein said oxidizable material comprises a metal selected from aluminum, titanium, tantalum, chromium, molybdenum, silicon, and tungsten.

14. The process of claim 11 wherein said second insulating film comprises silicon nitride.

15. A process for fabricating an electro-optical device comprising the steps of:

forming a semiconductor island comprising crystalline silicon over a substrate;

forming a gate insulating film on said semiconductor island;

forming a gate wiring over said substrate, said gate wiring comprising an oxidizable material and including a gate electrode located over said semiconductor island, the gate electrode having a side face;

forming an oxide layer by oxidizing said gate wiring thereon;

performing a first introduction of impurity ions into said semiconductor island using said gate electrode and said oxide layer as a first mask;

forming side spacers adjacent to the side face of said gate electrode;

performing a second introduction of impurity ions into said semiconductor island using said gate electrode, said oxide layer and said side spacers as a second mask; and depositing an insulating layer after the second introduction of impurity ions.

16. The process of claim 15 wherein said oxidizing step is carried out by anodic oxidation.

17. The process of claim 15 wherein said oxidizable material comprises a metal selected from aluminum, titanium, tantalum, chromium, molybdenum, silicon, and tungsten.

18. The process of claim 15 wherein said insulating layer comprises silicon nitride.

* * * * *